United States Patent
Chen et al.

(10) Patent No.: US 8,830,438 B2
(45) Date of Patent: Sep. 9, 2014

(54) LCD PANEL AND MANUFACTURING METHOD FOR THE SAME

(75) Inventors: Cheng-hung Chen, Guandong (CN); Zui Wang, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 27 days.

(21) Appl. No.: 13/576,401

(22) PCT Filed: Jun. 21, 2012

(86) PCT No.: PCT/CN2012/077299
§ 371 (c)(1),
(2), (4) Date: Aug. 1, 2012

(87) PCT Pub. No.: WO2013/185372
PCT Pub. Date: Dec. 19, 2013

(65) Prior Publication Data
US 2013/0335686 A1    Dec. 19, 2013

(30) Foreign Application Priority Data
Jun. 13, 2012  (CN) .......................... 2012 1 0194332

(51) Int. Cl.
*G02F 1/1339* (2006.01)
*G02F 1/13* (2006.01)
*G02F 1/1335* (2006.01)
*H01L 27/15* (2006.01)

(52) U.S. Cl.
CPC .......... *G02F 1/1335* (2013.01); *G02F 2202/28* (2013.01); *G02F 1/13* (2013.01); *G02F 1/1339* (2013.01); *H01L 27/156* (2013.01)
USPC .......................................... 349/153; 349/190

(58) Field of Classification Search
CPC ..................................................... G02F 1/1339
USPC .................................................. 349/153, 190
See application file for complete search history.

(56) References Cited

U.S. PATENT DOCUMENTS

| | | | |
|---|---|---|---|
| 5,517,344 A * | 5/1996 | Hu et al. ....................... | 349/153 |
| 6,222,603 B1 * | 4/2001 | Sakai et al. .................. | 349/153 |
| 2004/0027531 A1 * | 2/2004 | Kim ............................. | 349/187 |
| 2005/0046778 A1 * | 3/2005 | Hsiao et al. .................. | 349/153 |
| 2011/0285954 A1 * | 11/2011 | Minami ....................... | 349/153 |
| 2012/0081651 A1 * | 4/2012 | Misaki ......................... | 349/153 |
| 2012/0268708 A1 * | 10/2012 | Chida .......................... | 349/153 |

* cited by examiner

*Primary Examiner* — Thanh-Nhan P Nguyen
(74) *Attorney, Agent, or Firm* — Andrew C. Cheng

(57) ABSTRACT

The present invention relates to a liquid crystal display (LCD) panel and its manufacturing method. The LCD panel comprises a first substrate, a second substrate, a sealant, and a barrier wall. The first substrate and the second substrate are disposed relatively. The sealant disposed surrounding between the first substrate and the second substrate. The barrier wall is disposed at the outer side of the area surrounded by the sealant, and the barrier wall is respectively abutted against the first substrate and the second substrate. In summary, the present invention could improve the overflow of the sealant, reducing the difficulty for narrow frame design and the requirement for cutting precision of the LCD panel.

7 Claims, 4 Drawing Sheets

LCD PANEL AND MANUFACTURING METHOD FOR THE SAME

BACKGROUND OF THE INVENTION

1. Field of the Invention

The present invention relates to the field of display technology, in particular, relates to a liquid crystal display panel and its manufacturing method.

2. Description of Related Art

In recent years, a variety of display technologies continue to flourish, LCD panels have been gradually commercialization and applied to the display devices of various sizes. In general, it uses a sealant to adhere a thin film transistor array substrate and a color filter substrate in the process of manufacturing the LCD panel. In the conventional art, there is a certain precision error in coating the sealant, and the sealant is non-solid-state. When the upper and lower substrates are laminated, the sealant is flowing to both sides so that the width of the sealant is increased. When cutting the panel, there also exists certain degree of precision errors. In order to ensure the effect of cutting, the sealant must maintain a certain distance with the cutting line to absorb the precision error. However, if the sealant is far away from the cutting line, it will increase the size of the LCD panel, making narrow frame design more difficult, and increasing the requirement for the cutting precision.

SUMMARY OF THE INVENTION

The main technical problem of the present invention is to provide an LCD panel and its manufacturing method that can reduce the difficulty for narrow frame design and the requirement for cutting precision.

To solve these technical problems, a technical solution used in this invention is to provide an LCD panel comprises:

a first substrate;

a second substrate disposed relatively to the first substrate;

a sealant disposed surrounding between the first substrate and the second substrate; and a barrier wall disposed between the first substrate and the second substrate, wherein the barrier wall is disposed at the outer side of the area surrounded by the sealant, and the barrier wall is respectively abutted against the first substrate and the second substrate, and the side surface of the barrier wall near the sealant is located at the inner side of the cutting line of the LCD panel;

Wherein, the first substrate is a color filter substrate and the second substrate is a thin film transistor array substrate; or the first substrate is a thin film transistor array substrate and the second substrate is a color filter substrate.

Wherein, the LCD panel further comprises a spacer and a color resist disposed between the first substrate and the second substrate, and the material of the barrier wall and the spacer or the color resist are the same.

Wherein, the height of the barrier wall is equal to the gap between the first substrate and the second substrate after lamination.

To solve these technical problems, another technical solution used in this invention is to provide an LCD panel comprises:

a first substrate;

a second substrate disposed relatively to the first substrate;

a sealant disposed surrounding between the first substrate and the second substrate; and a barrier wall disposed between the first substrate and the second substrate, wherein the barrier wall is disposed at the outer side of the area surrounded by the sealant, and the barrier wall is respectively abutted against the first substrate and the second substrate.

Wherein, the first substrate is a color filter substrate and the second substrate is a thin film transistor array substrate; or the first substrate is a thin film transistor array substrate and the second substrate is a color filter substrate.

Wherein, the LCD panel further comprises a spacer and a color resist disposed between the first substrate and the second substrate, and the material of the barrier wall and the spacer or the color resist are the same.

Wherein, the height of the barrier wall is equal to the gap between the first substrate and the second substrate after lamination.

Wherein, the side surface of the barrier wall near the sealant is located at the inner side of the cutting line of the LCD panel.

To solve these technical problems, another technical solution used in this invention is to provide a manufacturing method for an LCD panel comprising:

providing a first substrate, coating a sealant on the first substrate, and disposing correspondingly a barrier wall on the outer side of area surrounded by the sealant;

providing a second substrate, and laminating the second substrate on the first substrate toward the direction of the sealant and the barrier wall; and curing the sealant so that the first substrate and second substrate are adhering together through the sealant.

Wherein, the first substrate is a color filter substrate and the second substrate is a thin film transistor array substrate; or the first substrate is a thin film transistor array substrate and the second substrate is a color filter substrate.

Wherein, the LCD panel further comprises a spacer and a color resist disposed between the first substrate and the second substrate, and the material of the barrier wall and the spacer or the color resist are the same.

Wherein, the height of the barrier wall is equal to the gap between the first substrate and the second substrate after lamination.

Wherein, the manufacturing method further comprises a step of cutting the LCD panel along the side of the barrier wall away from sealant or on the barrier wall after curing the sealant.

The beneficial effects of the present invention are: different from the existing technology, the LCD panel and its manufacturing method of the present invention disposes a barrier wall so as to improve the overflow of the sealant, reduce the difficulty of narrow frame design, and the requirement for cutting precision of the panel.

DETAILED DESCRIPTION OF THE PREFERRED EMBODIMENT

Figure 1:
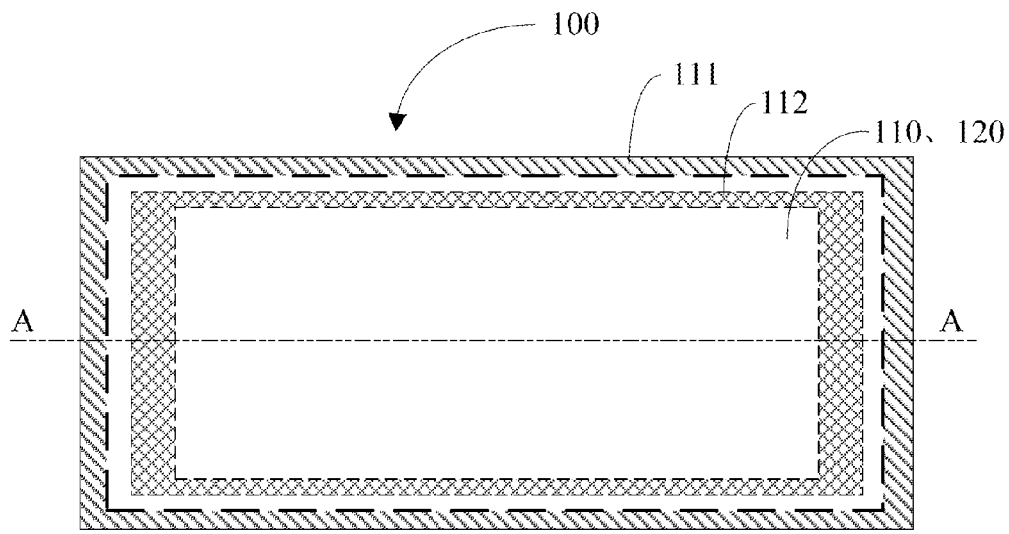
FIG. 1 is a perspective schematic top drawing of the LCD panel of the first embodiment.
Figure 2:
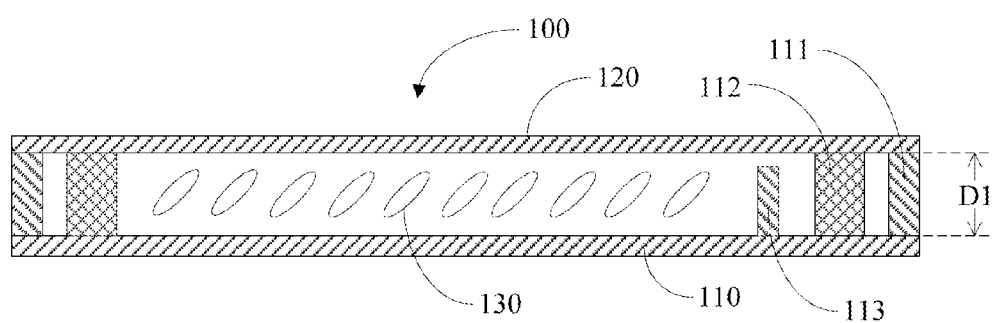
FIG. 2 is a cross-section drawing of the LCD panel along the A-A line in FIG. 1.

As shown in FIG. 1, it is a perspective schematic top drawing of the LCD panel of the first embodiment, and FIG. 2 is a cross-section drawing of the LCD panel along the A-A line in FIG. 1.

Please refer both FIG. 1 and FIG. 2. In this embodiment, an LCD (liquid crystal display) panel 100 includes a first substrate 110, a second substrate 120, a barrier wall 111, a sealant 112, and a liquid crystal 130. The first substrate 110 and the second substrate 120 are disposed relatively.

In this embodiment, the first substrate 110 is a color filter substrate, and the second substrate 120 is a thin film transistor array substrate. Alternatively, the first substrate 110 is a thin film transistor array substrate, and the second substrate 120 is a color filter substrate. In other embodiments, the first substrate 110 can be other forms of active component array substrate and the second substrate 120 can be a substrate, such as a color filter substrate, a black matrix substrate, or a common electrode substrate.

A liquid crystal layer comprises the liquid crystal 130 is disposed between the first substrate 110 and the second substrate 120. The sealant 112 is disposed surrounding between the first substrate 110 and the second substrate 120 for adhering the first substrate 110 and the second substrate 120 to seal the liquid crystal layer. Wherein, the outer side of the area surrounded by the sealant 112 (i.e., toward the side of the barrier wall 111) is the non-display area of the LCD panel 100, and the inner side of the area surrounded by the sealant 112 is the display area of the LCD panel 100.

The barrier wall 111 is disposed at the non-display area of the LCD panel 100 and between the first substrate 110 and the second substrate 120. Specifically, the barrier wall 111 is disposed at the outer side of the area surrounded by the sealant 112. The top surface of the barrier wall 111 and bottom surface of the barrier wall 111 is respectively abutted against the first substrate 110 and the second substrate 120. In the present invention embodiment, the barrier wall 111 could be disposed on the first substrate 110 or the second substrate 120, and abutted against the other substrate. Therefore, the height of the barrier wall 111 is equal to the gap D1 between the first substrate 110 and the second substrate 120 after lamination. It should be understood that although in this embodiment, the barrier wall 111 is a rectangular barrier wall. However, in other embodiments, the barrier wall 111 can be a curved barrier wall or other shapes.

In this embodiment, the LCD panel 100 further includes a spacer 113 and a color resist (not shown) deposed between the first substrate 110 and the second substrate 120. The material of the barrier wall 111 and the spacer 113 or the color resist (not shown) are the same.

As shown in FIG. 2, There is a certain distance between the sealant 112 and the barrier wall 111. When the sealant 112 is overflowing, it is stopped by the barrier wall 111 to prevent the sealant 112 from flowing outward in laminating the first substrate 110 and the second substrate 120. The barrier wall 111 could limit the overflow range of the sealant 112 so as to reduce the precision error range in coating the sealant 112.

Furthermore, when cutting the large substrate to obtain the LCD panel 100 with required size, it could be cut along the side of the barrier wall 111 away from the sealant 112 or directly on the barrier wall 111, reducing the requirement for cutting precision.

As the above description, the barrier wall 111 could avoid the influence of the coating precision error of the sealant 112 and the cutting precision error of the panel 100 so as to shorten the distance between the sealant 112 and the cutting line, reducing the size of the frame of the LCD panel. Therefore, it reduces the difficulty for the narrow frame design and the requirement for the cutting precision of the panel.

Figure 3:
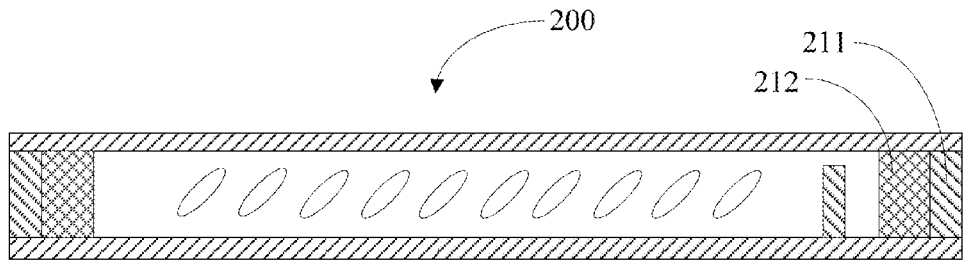
FIG. 3 is a cross-section drawing of the LCD panel of the second embodiment.

Furthermore, please referring to FIG. 3, it is a cross-section drawing of the LCD panel of the second embodiment. It can calculate the amount of the overflow of the sealant after lamination process by pre-simulation and determine the location of the barrier wall according to the amount of the overflow. Preferably, it can select that the gap between the barrier wall 212 and the sealant 211 could contain the amount of the overflow precisely.

Specifically, as shown in FIG. 3, comparing to the aforementioned LCD panel 100, the main difference of the LCD panel 200 is that in this embodiment, the sealant 212 contact completely to the surface of barrier wall 211 faced to the sealant 212. The LCD panel 200 further narrows the width of the frame of the panel so as to achieve a narrow frame design. Similarly, in this embodiment, the barrier wall 211 stops sealant 212 and prevent the sealant 212 from overflowing outward further.

Figure 4:
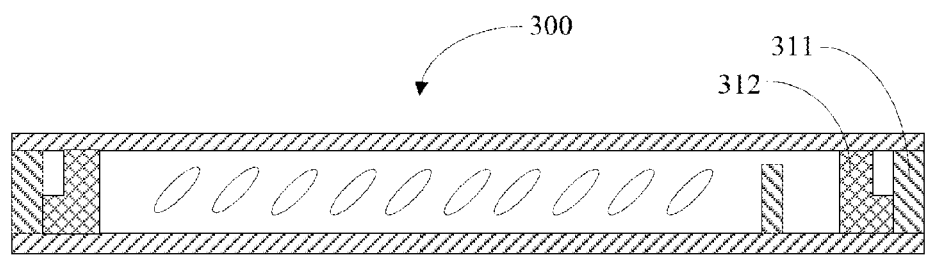
FIG. 4 is a cross-section drawing of the LCD panel of the third embodiment.

Please refer to FIG. 4. It is a cross-section drawing of the LCD panel of the third embodiment. Comparing to the aforementioned LCD panel 100, the main difference of the LCD 300 in this embodiment is that the overflow situation of the sealant 312 is larger such that the sealant 312 contact partly to the surface of the barrier wall 311 faced to the sealant 312.

Similarly, in this embodiment, the barrier wall 311 stops the sealant 312 and prevents the sealant 312 from overflowing further.

It should be understood by the above mentioned three embodiments, the present invention is not limited to the contact degree between the barrier wall and sealant. The sealant can isolate with the barrier wall, partially contact with barrier wall, or completely contact with the barrier wall according to the actual overflow situation and the location of the barrier wall.

Figure 5:
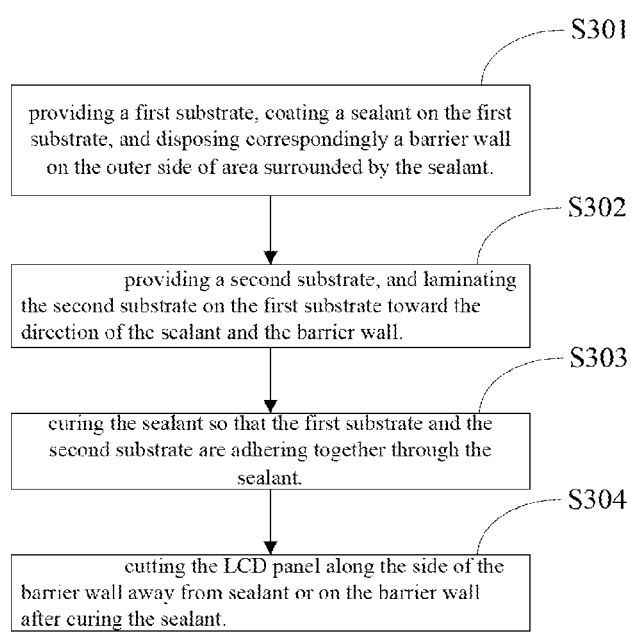
FIG. 5 is a flow chart of the manufacturing method for the LCD panel of the present invention.

Please refer to FIG. 5. It is a flow chart of the manufacturing method for the LCD panel of the present invention. The manufacturing method for the LCD panel of the present invention includes:

Step S301: Providing a first substrate, coating a sealant on the first substrate, and disposing correspondingly a barrier wall on the outer side of the area surrounded by the sealant.

Step S302: Providing a second substrate, and laminating the second substrate on the first substrate toward the direction of the sealant and the barrier wall.

Step S303: Curing the sealant so that the first substrate and second substrate are adhering together through the sealant.

Step S304: Cutting the LCD panel along the side of the barrier wall away from sealant or directly on the barrier wall after curing the sealant.

Figure 6:
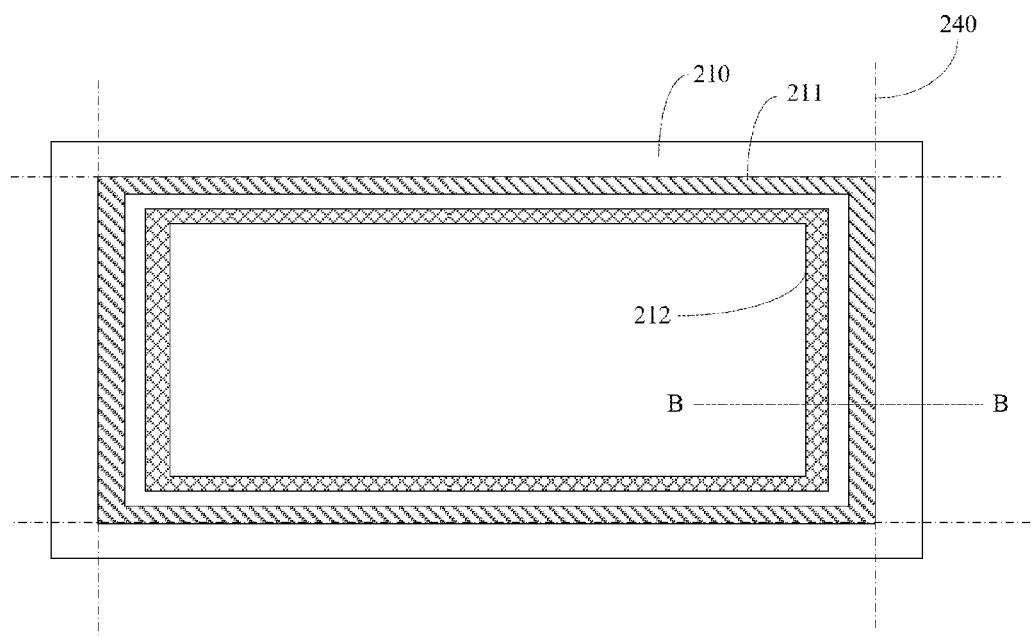
FIG. 6 is a top drawing of the first substrate of the step S301 in FIG. 5.
Figure 7:
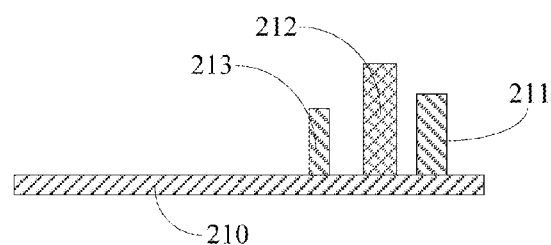
FIG. 7 is a schematic cross-section drawing along B-B line of the first substrate in FIG. 6.

The following using the manufacturing of the aforementioned LCD panel 200 as an example. As shown in FIG. 6 and FIG. 7, FIG. 6 is a top drawing of the first substrate of the step S301 in FIG. 5 and FIG. 7 is a schematic cross-section drawing along B-B line of the first substrate in FIG. 6.

As shown in FIG. 6 and FIG. 7, in the step S301, providing a first substrate 210, coating a sealant 212 on the first substrate 210, and disposing correspondingly a barrier wall 211 on the outer side of the area surrounded by the sealant 212.

Wherein, the first substrate 210 further disposes a spacer 213. In this embodiment, the material of the barrier wall 211 and the spacer 213 are the same. In other embodiments, the barrier wall 211 can choose other materials with certain thickness and can be precise coating, for example, a color resist.

And the sealant 212 is for adhering the first substrate 210 and the second substrate 220 so that the height of the sealant 212 in coating is slightly higher than the height of the barrier wall 211.

In the embodiments of the present invention, it can calculate the amount of the overflow of the sealant 212 after lamination process by pre-simulation and determine the location of the barrier wall 211 according to the amount of the overflow. When coating the sealant 212, the gap between sealant 212 and the barrier wall 211 should be chosen to sufficiently contain the amount of the overflow.

Preferably, it can select that the gap between the barrier wall 212 and the sealant 211 could contain the amount of the overflow precisely.

Figure 8:
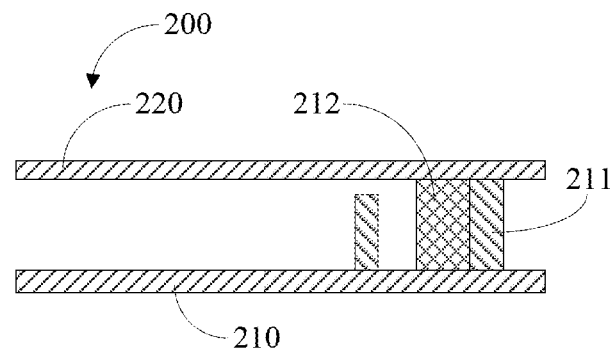
FIG. 8 is a schematic cross-section drawing of the implementation of the step S302 in FIG. 5.

As shown in FIG. 8, in the step S302, providing a second substrate 220, and laminating the second substrate 220 on the first substrate 210 toward the direction of the sealant 212 and the barrier wall 211.

In this step, the sealant 212 occurs overflow in lamination process of the second substrate 220. When the sealant 212 is overflowing, the width of the sealant 212 become wider, and when the sealant 212 overflow to the barrier wall 211, it stop overflowing outward by the barrier wall 211.

Wherein, the height of the barrier wall 211 is equal to the gap between the first substrate 210 and the second substrate 220 after lamination such that the barrier wall 211 could stop the overflow of the sealant 212.

In the step S303, curing the sealant 212 so that the first substrate 210 and the second substrate 220 are adhered together by the sealant 212.

Figure 9:
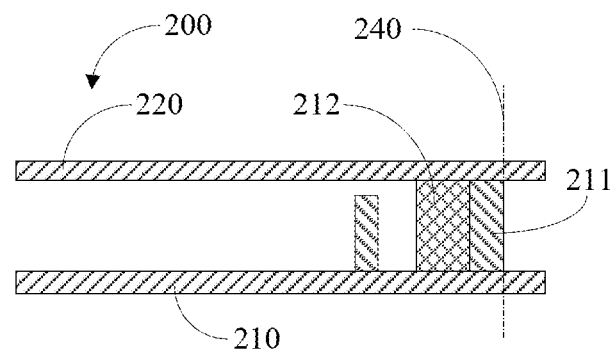
FIG. 9 is a schematic cross-section drawing of the implementation of the step S304 in FIG. 5.

After the first substrate 210 and the second substrate 220 are adhered together by sealant 212 and cutting to obtain the LCD panel 200 with required size, please refer to the FIG. 8 and FIG. 9. In the step S304, after curing the sealant 212. the LCD panel 200 can be cut along the side of the barrier wall 211 away from the sealant 212 or on the barrier wall 211 itself.

Figure 10:
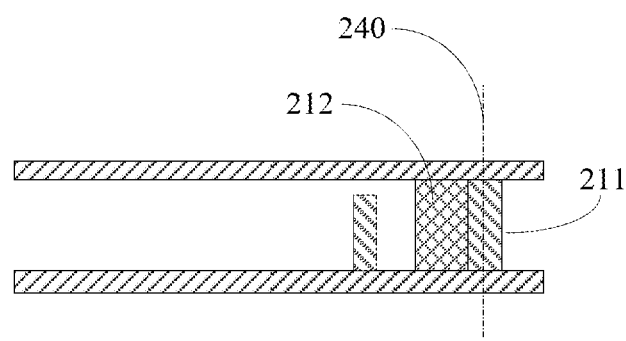
FIG. 10 is a schematic cross-section drawing of the implementation of the step S304 in FIG. 5.

Wherein, FIG. 9 a schematic drawing of cutting along the side of the barrier wall 211 away from the sealant 212 and FIG. 10 is a schematic drawing of cutting on the barrier wall 211.

Specifically, in FIG. 6, FIG. 9, or FIG. 10, the dotted line 240 is the cutting line of the LCD panel. In the present invention, it only have to ensure that the side surface of the barrier wall 211 near sealant 212 is located at the inner side of the cutting line 240. Therefore, the LCD panel 200 can be cut along the side of the barrier wall 211 away from the sealant 212 or on the barrier wall 211 itself so as to reduce the requirement for cutting precision.

It should be understood, the manufacturing method of the LCD panel 100 and the LCD panel 300 and the aforementioned manufacturing method of the LCD panel 200 are basically the same, and not repeat them here.

In summary, in the present invention, the LCD panel and its manufacturing method are provided with a barrier wall to stop the overflow of the sealant, reducing the difficulty for narrow frame design and the requirement for cutting precision of the LCD panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An LCD panel comprising:
   a first substrate;
   a second substrate disposed relatively to the first substrate;
   a sealant disposed surrounding between the first substrate and the second substrate; and
   a barrier wall disposed between the first substrate and the second substrate, wherein the barrier wall is disposed only at the outer side of the area surrounded by the sealant, and the barrier wall is disposed surrounding the sealant, and the barrier wall is respectively abutted against the first substrate and the second substrate, and the side surface of the barrier wall near the sealant is located at the inner side of the cutting line of the LCD panel, and the cutting line is located on the barrier wall;
   wherein, the first substrate is a color filter substrate and the second substrate is a thin film transistor array substrate; or the first substrate is a thin film transistor array substrate and the second substrate is a color filter substrate.

2. The LCD panel according to claim 1, wherein the LCD panel further comprises a spacer and a color resist disposed between the first substrate and the second substrate, and the material of the barrier wall and the spacer or the color resist are the same.

3. The LCD panel according to claim 1, wherein the height of the barrier wall is equal to the gap between the first substrate and the second substrate after lamination.

4. An LCD panel comprising:
   a first substrate;
   a second substrate disposed relatively to the first substrate;
   a sealant disposed surrounding between the first substrate and the second substrate; and
   a barrier wall disposed between the first substrate and the second substrate, wherein the barrier wall is disposed only at the outer side of the area surrounded by the sealant, and the barrier wall is disposed surrounding the sealant, and the barrier wall is respectively abutted against the first substrate and the second substrate, and the side surface of the barrier wall near the sealant is located at the inner side of the cutting line of the LCD panel, and the cutting line is located on the barrier wall.

5. The LCD panel according to claim 4, wherein the first substrate is a color filter substrate and the second substrate is a thin film transistor array substrate; or the first substrate is a thin film transistor array substrate and the second substrate is a color filter substrate.

6. The LCD panel according to claim 5, wherein the LCD panel further comprises a spacer and a color resist disposed between the first substrate and the second substrate, and the material of the barrier wall and the spacer or the color resist are the same.

7. The LCD panel according to claim 5, wherein the height of the barrier wall is equal to the gap between the first substrate and the second substrate after lamination.

* * * * *